United States Patent
Yoshida et al.

(10) Patent No.: US 9,842,736 B2
(45) Date of Patent: Dec. 12, 2017

(54) SEMICONDUCTOR PHOTO-RECEIVING DEVICE

(71) Applicant: KABUSHIKI KAISHA TOSHIBA, Minato-ku (JP)

(72) Inventors: Haruhiko Yoshida, Funabashi (JP); Kazuya Ohira, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/390,905

(22) Filed: Dec. 27, 2016

(65) Prior Publication Data

US 2017/0271544 A1    Sep. 21, 2017

(30) Foreign Application Priority Data

Mar. 18, 2016 (JP) ................................. 2016-055631

(51) Int. Cl.
*H01L 31/0232* (2014.01)
*H01L 21/00* (2006.01)
*H01L 21/02* (2006.01)

(52) U.S. Cl.
CPC .. *H01L 21/02683* (2013.01); *H01L 31/02327* (2013.01)

(58) Field of Classification Search
CPC .................................. H01L 21/02683
USPC ..................................... 257/432; 438/31, 69
See application file for complete search history.

(56) References Cited

U.S. PATENT DOCUMENTS

| 5,761,361 | A | * | 6/1998 | Pfandl | G02B 6/44 385/100 |
|---|---|---|---|---|---|
| 6,978,067 | B2 | | 12/2005 | Herbert et al. | |
| 2003/0151057 | A1 | | 8/2003 | Iguchi et al. | |
| 2004/0013367 | A1 | | 1/2004 | Herbert et al. | |
| 2014/0044391 | A1 | | 2/2014 | Iizuka et al. | |
| 2015/0253487 | A1 | * | 9/2015 | Nichol | G02B 6/0036 362/610 |

FOREIGN PATENT DOCUMENTS

| JP | 2003-234494 A | 8/2003 |
|---|---|---|
| JP | 2005-159002 A | 6/2005 |

(Continued)

OTHER PUBLICATIONS

Attila Mekis, et al., "A Grating-Coupler-Enabled CMOS Photonics Platform", IEEE Journal of Selected Topics in Quantum Electronics, vol. 17, No. 3, May-Jun. 2011, pp. 597-608.

*Primary Examiner* — Calvin Lee
(74) *Attorney, Agent, or Firm* — Oblon, McClelland, Maier & Neustadt, L.L.P.

(57) ABSTRACT

According to one embodiment, a semiconductor photo-receiving device includes a substrate, a light propagation layer and a semiconductor layer including a lowest layer and upper layers. The upper layers include an optical absorption layer. The light propagation layer includes a first light input layer, a first annular layer at a desired distance from the first light input layer, and a first optical waveguide connecting the first light input layer and annular layer. The lowest layer of the semiconductor layer includes a second light input layer, a second annular layer at a desired distance from the second light input layer, and a second optical waveguide connecting the second light input layer and annular layer.

11 Claims, 6 Drawing Sheets

(56) References Cited

FOREIGN PATENT DOCUMENTS

| JP | 2007-158204 A | 6/2007 |
|---|---|---|
| JP | 2012-204706 A | 10/2012 |
| JP | 2013-80188 A | 5/2013 |
| JP | 2014-35498 A | 2/2014 |

* cited by examiner

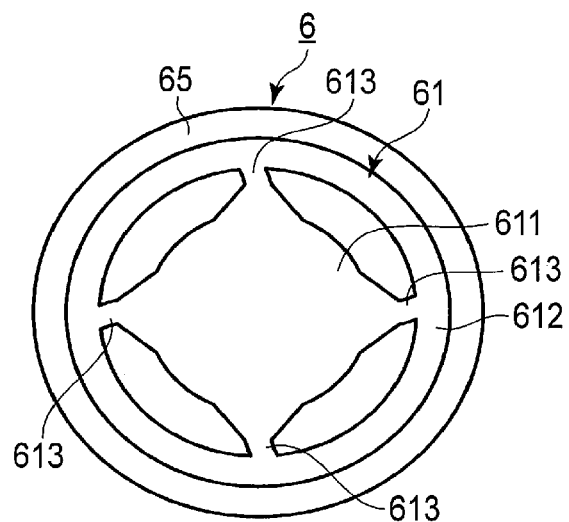
F I G. 3
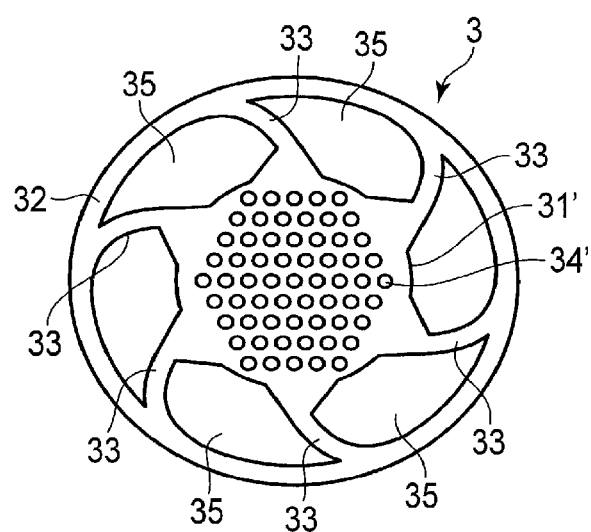
F I G. 5

SEMICONDUCTOR PHOTO-RECEIVING DEVICE

CROSS-REFERENCE TO RELATED APPLICATIONS

This application is based upon and claims the benefit of priority from Japanese Patent Application No. 2016-055631, filed Mar. 18, 2016, the entire contents of which are incorporated herein by reference.

FIELD

Embodiments described herein relate generally to a semiconductor photo-receiving device.

BACKGROUND

As is well known, semiconductor photo-receiving devices are semiconductor devices configured to detect light by subjecting incident light to photoelectric conversion. The semiconductor photo-receiving devices are classified into an end-face photo-receiving device configured to receive light at an end face of an optical absorption layer included in a semiconductor layer, and a surface photo-receiving device configured to receive light at a surface of the optical absorption layer.

In the end-face photo-receiving device, light enters the optical absorption layer through an end face thereof, and is scattered along a surface of the optical absorption layer. Accordingly, the light absorption efficiency of this device is high at the optical absorption layer, which means that the device exhibits a high photoelectric conversion performance. However, it is difficult for the end-face photo-receiving device to realize optical coupling with high accuracy at the end face as a photo-receiving part, which makes the structure complex.

The surface photo-receiving device comprises a substrate made of, for example, a group III-V semiconductor, a filter portion formed on the substrate and having wavelength selectivity, and a photo-detector formed on the filter portion and including an optical absorption layer. In this photo-receiving device, since light enters the photo-detector through the filter portion from the substrate side, optical coupling can be realized easily.

On the other hand, in order to receive a fast-modulated light signal, it is desirable to sufficiently reduce the photo-receiving area of the semiconductor photo-receiving device, thereby reducing its capacity.

Embodiments provide semiconductor photo-receiving devices capable of receiving light from their substrate side, and capable of increasing the absorption efficiency of incident light using an optical absorption layer of a small photo-receiving area.

BRIEF DESCRIPTION OF THE DRAWINGS

FIG. 3 is a plan view showing the lowest layer of a semiconductor layer incorporated in the semiconductor photo-receiving device of the embodiment.

FIG. 5 is a plan view showing a light-propagation layer incorporated in a semiconductor photo-receiving device according to another embodiment.

DETAILED DESCRIPTION

Figure 1:
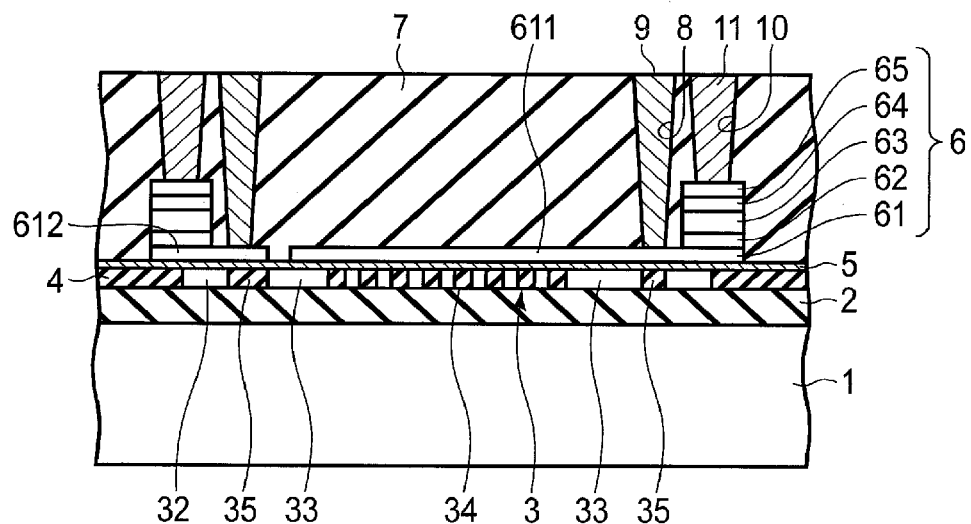
FIG. 1 is a cross-sectional view showing a semiconductor photo-receiving device according to an embodiment.

In general, according to one embodiment, a semiconductor photo-receiving device comprises a substrate; a light propagation layer provided on the substrate; a semiconductor layer provided on the light propagation layer, the semiconductor layer including a lowest layer and upper layers, the upper layers including an optical absorption layer; and an electrode which applies a voltage to the optical absorption layer. The light propagation layer comprises a first light input layer, a first annular layer provided around the first light input layer at a desired distance from the first light input layer, and a first optical waveguide connecting the first light input layer to the first annular layer. The lowest layer of the semiconductor layer comprises a second light input layer, a second annular layer provided around the second light input layer at a desired distance from the second light input layer, and a second optical waveguide connecting the second light input layer to the second annular layer. The first and second light input layers oppose each other, the first and second annular layers oppose each other, and the first and second optical waveguides oppose each other. The first light input layer includes a diffraction grating. The upper layers are formed annular.

In the semiconductor photo-receiving device of the embodiment, the semiconductor layer comprises the lowest layer and the annular upper layers including the optical absorption layer. The lowest layer functions as a photo-receiving portion.

The substrate, for example, can be used a silicon having a high light transmittance.

The first annular layer and the first optical waveguide incorporated in the light propagation layer can be made of silicon, such as amorphous silicon or polycrystalline silicon.

It is preferable to form the light propagation layer to have a thickness of 0.2 to 0.5 μm. The light propagation layer of this thickness can further efficiently propagate light, which is entered from the substrate side, to the lowest semiconductor layer of the annular semiconductor layer.

A diffraction grating included in the first light input layer of the light propagation layer comprises a matrix layer made of silicon, and a plurality of areas two-dimensionally and cyclically provided in the matrix layer. Specifically, the diffraction grating has a structure, in which a plurality of small holes are two-dimensionally cyclically formed in a matrix layer made of silicon, such as polycrystalline silicon, and are filled with a material having a lower refraction index than silicon, thereby forming the above-mentioned areas. Examples of the low-refraction-index material include $SiO_2$, SiN, AlN, $Al_2O_3$ and $AlO_x$ ($1<x<1.5$).

It is preferable that the first light input layer have a shape coinciding with the second light input layer, or similar to and smaller than the latter.

It is also preferable to position the inner and outer peripheral edges of the first annular layer inside of the inner and outer peripheral edges of the second annular layer, respectively.

It is further preferable that the first optical waveguide have a shape coinciding with the second optical waveguide, or similar to and smaller than the latter. It is preferable that two or more first optical waveguides be used to connect the first light input layer to the first annular layer. Similarly, it is preferable that two or more second optical waveguides be used to connect the second light input layer to the second annular layer.

The semiconductor layer including the lowest layer and the annular upper layers is made of, for example, a group III-V compound semiconductor. That is, the semiconductor layer as the lowest layer comprising the second light input layer, the second annular layer and the second optical waveguide, which oppose the first light input layer, the first annular layer and the first optical waveguide, respectively, is made of the group III-V semiconductor. Examples of group III-V compound semiconductor include an InP-based compound semiconductor, a GaAs-based compound semiconductor, or a GaN-based compound semiconductor.

A semiconductor layer made of the InP-based compound semiconductor has a structure in which a contact layer of InP or InGaAs, a cladding layer of InGaAsP or InP, a light confinement layer of InGaAsP, a multiplex quantum well layer (an optical absorption layer) of InGaAsP/InGaAsP, a light confinement layer of InGaAsP, a cladding layer of InGaAsP or InP, and a contact layer of InP or InGaAs, are vertically provided in this order on the substrate.

A semiconductor layer made of another InP-based compound semiconductor has a structure in which a contact layer of InP or InGaAs, a cladding layer of InGaAlAs or InP, a light confinement layer of InGaAlAs, a multiplex quantum well layer (an optical absorption layer) of InGaAlAs/InGaAlAs, a light confinement layer of InGaAlAs, a cladding layer of InGaAlAs or InP, and a contact layer of InP or InGaAs, are vertically provided in this order on the substrate.

A semiconductor layer made of the GaAs-based compound semiconductor has a structure in which a contact layer of AlGaAs or GaAs, a cladding layer of InGaAs or GaAs, a light confinement layer of InGaAs, a multiplex quantum well layer (an optical absorption layer) of InGaAs/GaAs, a light confinement layer of InGaAs, a cladding layer of InGaAs or GaAs, and a contact layer of AlGaAs or GaAs, are vertically provided in this order on the substrate.

A semiconductor layer made of another GaAs-based compound semiconductor has a structure in which a contact layer of GaAs, a cladding layer of AlGaAs or GaAs, a light confinement layer of AlGaAs, a multiplex quantum well layer (optical absorption layer) of AlGaAs/GaAs, a light confinement layer of AlGaAs, a cladding layer of AlGaAs or GaAs, and a contact layer of GaAs, are vertically provided in this order on the substrate.

A semiconductor layer made of yet another GaAs-based compound semiconductor has a structure in which a contact layer of GaAs, a cladding layer of AlGaInP or GaAs, a light confinement layer of AlGaInP, a multiplex quantum well layer (an optical absorption layer) of AlGaInP/GaAs, a light confinement layer of AlGaInP, a cladding layer of AlGaInP or GaAs, and a contact layer of GaAs, are vertically provided in this order on the substrate.

A semiconductor layer made of the GaN-based compound semiconductor has a structure in which a contact layer of GaN or InGaN, a cladding layer of AlGaN or GaN, a light confinement layer of AlGaN or GaN, a multiplex quantum well layer (an optical absorption layer) of InGaN/AlGaN, a light confinement layer of AlGaN or GaN, a cladding layer of AlGaN or GaN, and a contact layer of GaN or InGaN, are vertically provided in this order on the substrate.

In the semiconductor layer made of the above-mentioned group III-V compound semiconductor, the cladding layer and the contact layer close to the substrate may be formed of a single layer (i.e., formed of a contact layer also serving as a cladding layer), and the cladding layer and the contact layer away from the substrate may also be formed of a single layer (i.e., formed of a contact layer also serving as a cladding layer).

The semiconductor layer can also be made of, for example, a group II-VI compound semiconductor (a ZnSe-based semiconductor, such as CdZnSSe).

Assuming that the wavelength of incident light is $\lambda$, it is preferable that the thickness d of the lowest layer of the semiconductor layer satisfy $\lambda \le d \le 2\lambda$. More preferably, the thickness d of the lowest layer is approx. $3/2\lambda$. The lowest semiconductor layer of this thickness can realize highly efficient optical coupling at the second light input layer and the second optical waveguide that constitute the compound semiconductor layer.

A pair of electrodes are connected to, for example, a direct current power supply, one of the electrodes being used as a positive electrode, and the other electrode being used as a negative electrode. The pair of electrodes are connected to respective layers (e.g., contact layers) included in the above-mentioned group III-V (or II-VI) compound semiconductor layers and serving as the lowest and highest layers. If the contact layer is InP-based, an electrode connected to the contact layer of a first conductivity type (for example, n type) can be formed of Ti/Pt/Au, and an electrode connected to the contact layer of a second conductivity type (for example, p type) can be formed of Ti/Pt/Au or Zn/Au. If the contact layer is GaAs-based, the electrode connected to the contact layer of the first conductivity type (for example, n type) can be made of AuGe/Ni/Au, and the electrode connected to the contact layer of the second conductivity type (for example, p type) can be made of Ti/Pt/Au.

Figure 2:
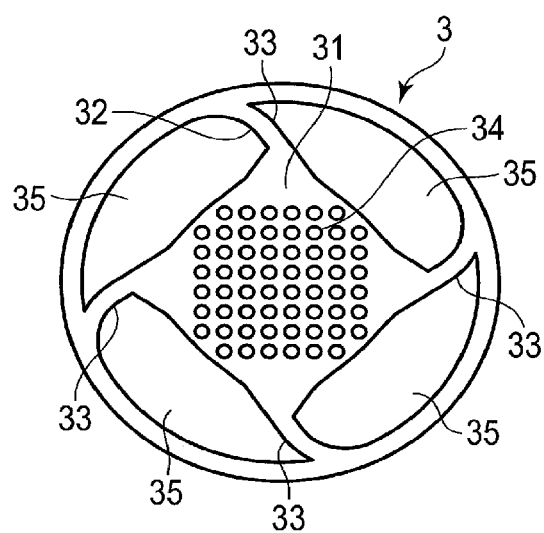
FIG. 2 is a plan view showing a light propagation layer incorporated in the semiconductor photo-receiving device of the embodiment.

Referring then to FIGS. 1 to 3, the semiconductor photo-receiving device according to the embodiment will be described in more detail. FIG. 1 is a cross-sectional view showing the semiconductor photo-receiving device of the embodiment. FIG. 2 is a plan view showing the light propagation layer provided on the substrate. FIG. 3 is a top view showing a semiconductor layer including the lowest semiconductor layer.

The semiconductor photo-receiving device according to the embodiment comprises a substrate 1 made of, for example, silicon having highly light transparency. An insulating layer 2 made of $SiO_2$ and having a low refraction index is provided on the major surface of the substrate 1. A light propagation layer 3 having a circular outer edge is provided on the insulating layer 2. A low-refraction-index film, for example, an SiO2 film 4, is provided on the insulating layer 2 around the light propagation layer 3 on the same plane as the light propagation layer 3.

The light propagation layer 3 is provided on the insulating layer 2, and comprises a first light input layer 31 having, for example, a substantially rectangular shape, a first annular/frame-shape layer (e.g., a first annular layer) 32 provided on the insulating film 2 around the first light input layer 31 at a desired distance therefrom, and a plurality of (for example, four) first optical waveguides 33 provided on the insulating film 2 and connecting the first light input layer 31 to the first annular layer 32, as is shown in FIG. 2.

A diffraction grating 34 is formed in the first light input layer 31. The diffraction grating 34 comprises an amorphous silicon layer having a plurality of circular through holes arranged two-dimensionally cyclically, and a plurality of areas formed by filling the holes with a low-refraction-index material, such as SiO2, so that these areas are same level with the amorphous silicon layer. The areas of the diffraction grating 34 are arranged in a square grating form. Each first optical waveguide 33 has its one end connected to a corner of the substantially rectangular first light input layer 31, and has the other end connected to, for example, the first annular layer 32 at right angles with respect thereto. Each first optical waveguide 33 has its width tapered from the first light input layer 31 to the first annular layer 32. Four areas 35, which are positioned between the first light input layer 31 and the first annular layer 32 and partitioned by the four optical waveguides 33, are formed of a low-refraction-index material, for example, SiO2. The low-refraction-index films 35 are provided on the $SiO_2$ film 4 including the light propagation layer 3.

A low-refraction-index film 5 is formed on the $SiO_2$ film 4 including the light propagation layer 3. A semiconductor layer 6 having a circular outer edge shape is provided on the low-refraction-index film 5, opposed to the light propagation layer 3. The semiconductor layer 6 has a structure in which a contact layer 61 made of, for example, a first conductivity type semiconductor, a light confinement layer 62 made of the first conductivity type semiconductor, a multiplex quantum well layer (an optical absorption layer) 63, a light confinement layer 64 made of a second conductivity type semiconductor, and a contact layer 65 made of the second conductivity type semiconductor are stacked in this order on the low-refraction-index film 5.

As shown in FIGS. 1 and 3, the contact layer 61 as the lowest layer comprises a substantially rectangular second light input layer 611 provided on the low-refraction-index film 5, opposed to the first light input layer 32, a second annular/frame-shape layer (for example, a second annular layer) 612 provided on the low-refraction-index film 5, opposed to the first annular layer 33, and a plurality of (for example, four) optical waveguides 612 provided on the low-refraction-index film 5, opposed to the first optical waveguides 33, and connecting the second light input layer 611 to the second annular layer 612. The second light input layer 611 has a shape coinciding with the first light input layer 31. The second annular layer 612 has a shape similar to and greater than the first annular layer 32. For example, the second annular layer 612 opposes the first annular layer 32 such that the inner and outer peripheral edges of the first annular layer 32 are positioned inside the inner and outer peripheral edges of the second annular layer 612, with the low-refraction-index film 5 interposed therebetween. Second optical waveguides 613 each have a shape coinciding with the first optical waveguides 33. Further, each second optical waveguide 613 has a width tapered from the second light input layer 611 to the second annular layer 612.

In the semiconductor layer 6, upper layers, i.e., the light confinement layer 62, the multiplex quantum well layer (an optical absorption layer) 63, the light confinement layer 64 and the contact layer 65 are formed annular. The contact layer 61 as the lowest layer constitutes a photo-receiving portion. The annular upper layers 62, 63, 64 and 65 have respective outer peripheral edges coinciding with the outer peripheral edge of the second annular layer 612 of the contact layer 61 as the lowest layer. Moreover, the annular upper layers 62, 63, 64 and 65 have their inner peripheral edges positioned inside the inner edge of the second annular layer 612 of the contact layer 61 as the lowest layer. That is, the inner peripheral edge of the second annular layer 612 is exposed through the annular layers 62, 63, 64 and 65, thereby forming an annular area. This annular area is used as a contact portion for one of a pair of electrodes described later.

An interlayer insulating film 7 is formed on the low-refraction-index film 5 to cover the semiconductor layer 6. For example, a first annular contact hole 8 is formed in the interlayer insulating film 7 such that the lower end of the hole is positioned in the annular area of the second annular layer 612 of the contact layer 61 as the lowest layer. An annular electrode 9 formed of a first conductivity type electrode material is provided in the first contact hole 8, and has its lower end kept in ohmic contact with the annular area of the second annular layer 612 of the contact layer 61 as the lowest layer. For example, a second annular contact hole 10 is formed in the interlayer insulating film 7 concentrically with respect to the first contact hole 8 such that the lower end of the hole is positioned on the contact layer 65 as the highest layer. An annular electrode 11 made of a second conductivity type electrode material is provided in the second contact hole 10, and has its lower end kept in ohmic contact with the contact layer 65 made of a second conductivity type compound semiconductor.

Referring next to FIGS. 4A to 4K, a description will be given of a method of manufacturing the semiconductor photo-receiving device shown in FIGS. 1 to 3.

Figure 4A:
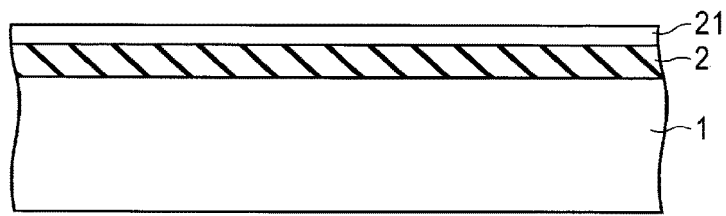
FIGS. 4A, 4B, 4C, 4D, 4E, 4F, 4G, 4H, 4I, 4J and 4K are cross-sectional views showing a process of manufacturing the semiconductor photo-receiving device of the embodiment.
Figure 4B:
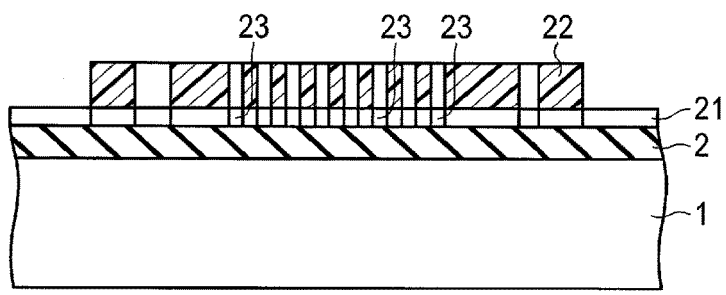
Figure 4C:
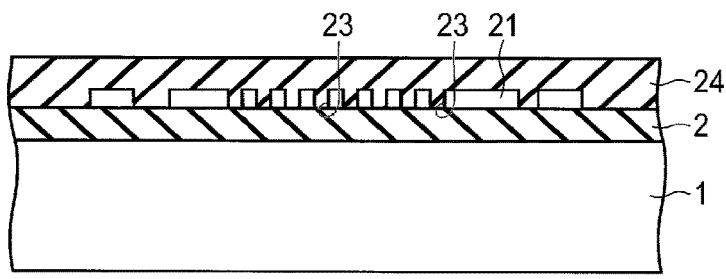

First, as shown in FIG. 4A, the insulating layer 2 and an amorphous silicon layer 21 are deposited on the substrate 1 in this order. Subsequently, a resist pattern 22 of, for example, the same shape as the above-mentioned light propagation layer shown in FIG. 2 is formed on the amorphous silicon layer 21 by a photolithography technique. Using the resist pattern 22 as a mask, the amorphous silicon layer 21 is selectively etched, thereby processing the outer shape of the light propagation layer. At the same time, a plurality of circular holes 23 extending through an area as a light input layer are formed in the shape of a square grating (see FIG. 4B). A low-refraction-index material layer 24 (for example, an $SiO_2$ layer) is deposited on the whole surface to have a sufficient thickness compared to the amorphous silicon layer 21 (see FIG. 4C).

Figure 4D:
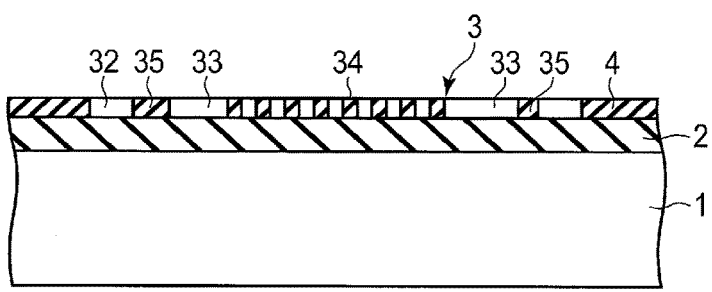
Figure 4E:
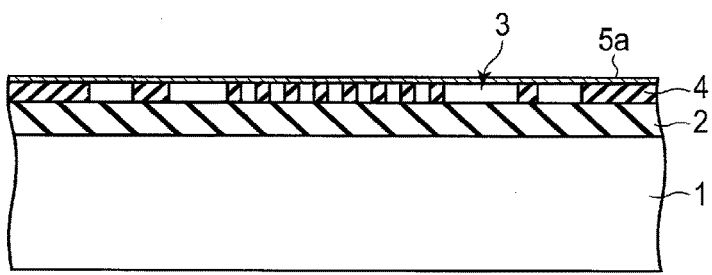
Figure 4F:
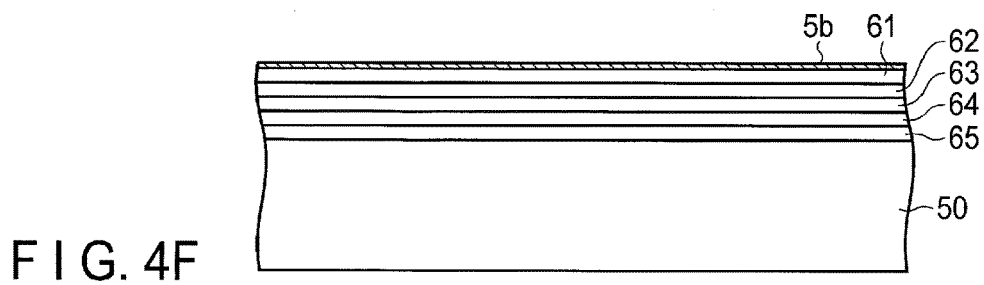

Subsequently, the $SiO_2$ layer 24 is etched back by, for example, mechanical chemical polishing (CMP), thereby forming the light propagation layer 3 and a low-refraction-index film, such as the $SiO_2$ film 4, on the insulating layer 2 to provide a flat surface, as is shown in FIG. 4D. The light propagation layer 3 comprises the substantially rectangular first light input layer 31, the first annular layer 32 provided around the first light input layer 31 at a desired distance therefrom, and the four optical waveguides 33 connected the first light input layer 31 to the first annular layer 32, as is shown in FIG. 2. The first light input layer 31 comprises the diffraction grating 34 formed by cyclically arranging a plurality of circular holes 23 in the form of a square grating in the amorphous silicon layer 21, and filling each circular hole 23 with a low-refraction-index material (for example, $SiO_2$), thereby forming a plurality of circular areas. After that, a low-refraction-index thin film, such as an $SiO_2$ thin film, is deposited on the light propagation layer 3 and the $SiO_2$ film 4, as is shown in FIG. 4E.

Figure 4G:
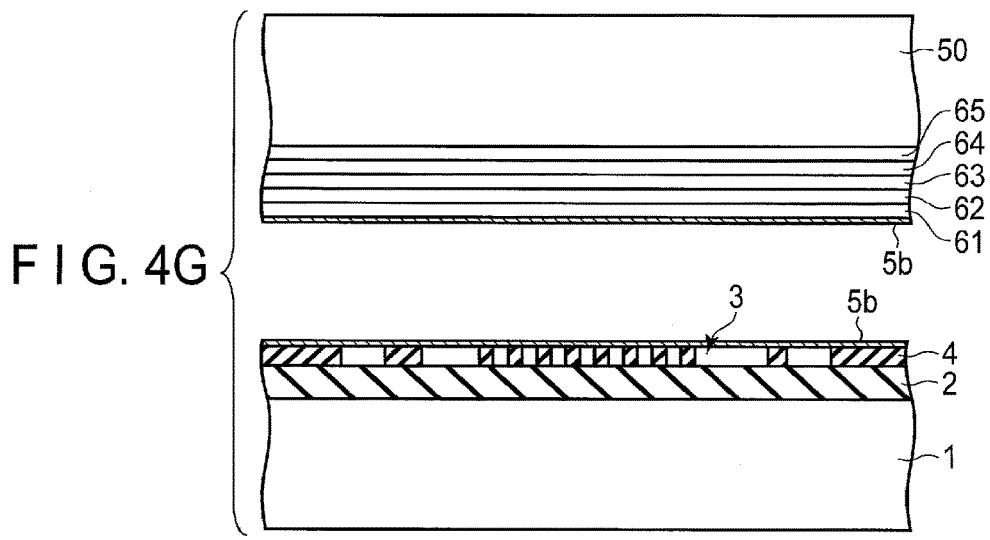
Figure 4H:
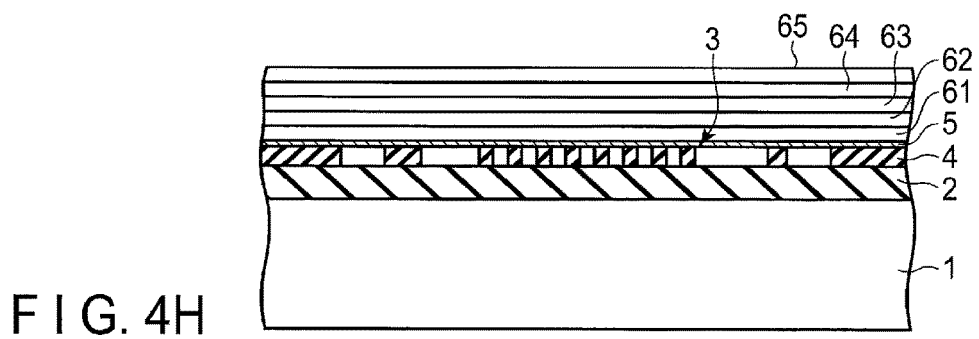

Further, the contact layer 65 made of the second conductivity type semiconductor, the light confinement layer 64 made of the second conductivity type semiconductor, the multiplex quantum well layer (optical absorption layer) 63, the light confinement layer 62 made of the first conductivity type semiconductor, and the contact layer 61 made of the first conductivity type semiconductor are deposited in this order on the substrate 50 made of the group III-V semiconductor, by epitaxial growth (metalorganic chemical vapor deposition: MOCVD, or molecular beam epitaxy: MBE). Thereafter, a low-refraction-index thin film 5b, such as an $SiO_2$ thin film, is deposited on the contact layer 61 as the highest layer (see FIG. 4F). Subsequently, as shown in FIG. 4G, the substrate 50 made of the group III-V semiconductor is inverted to oppose the $SiO_2$ thin film 5b as the lowest layer to the $SiO_2$ thin film 5a as the highest layer of the substrate 1. Subsequently, the $SiO_2$ thin film 5b and the $SiO_2$ thin film 5a are made to contact each other and joined. At this time, the contact layer 61 made of the first conductivity type semiconductor is joined to the light propagation layer 3 and the low-refraction-index film, such as the $SiO_2$ film 4, through the SiO2 film 5 interposed therebetween. On the contact layer 61, the light confinement layer 62 made of the first conductivity type semiconductor, the multiplex quantum well layer (an optical absorption layer) 63, the light confinement layer 64 made of the second conductivity type semiconductor, and the contact layer 65 made of the second conductivity type semiconductor are stacked in this order. After that, the substrate 50 made of the group III-V semiconductor, which is served as the highest layer, is all eliminated by CMP or wet etching (see FIG. 4H).

Figure 4I:
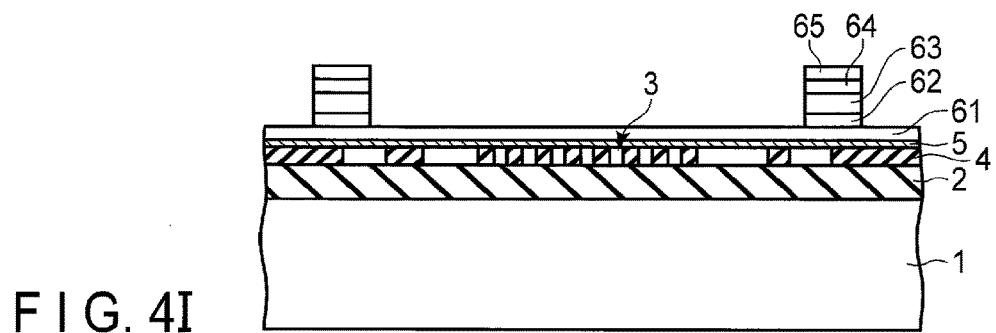
Figure 4J:
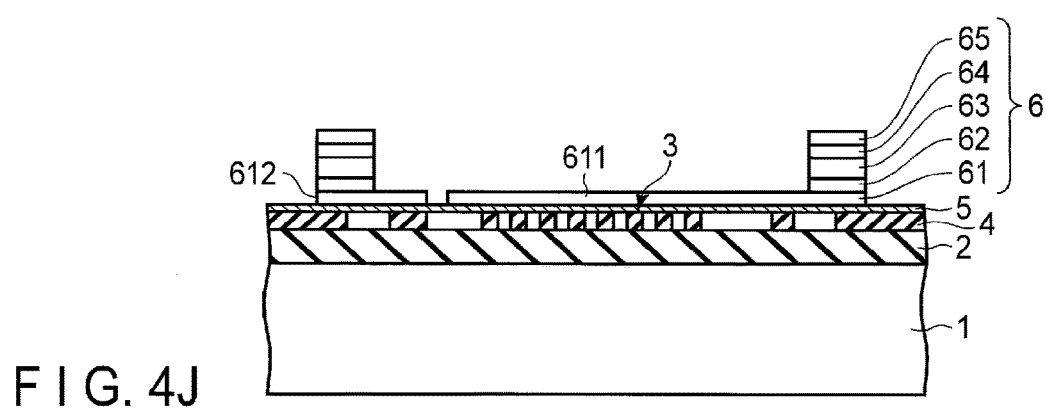
Figure 4K:
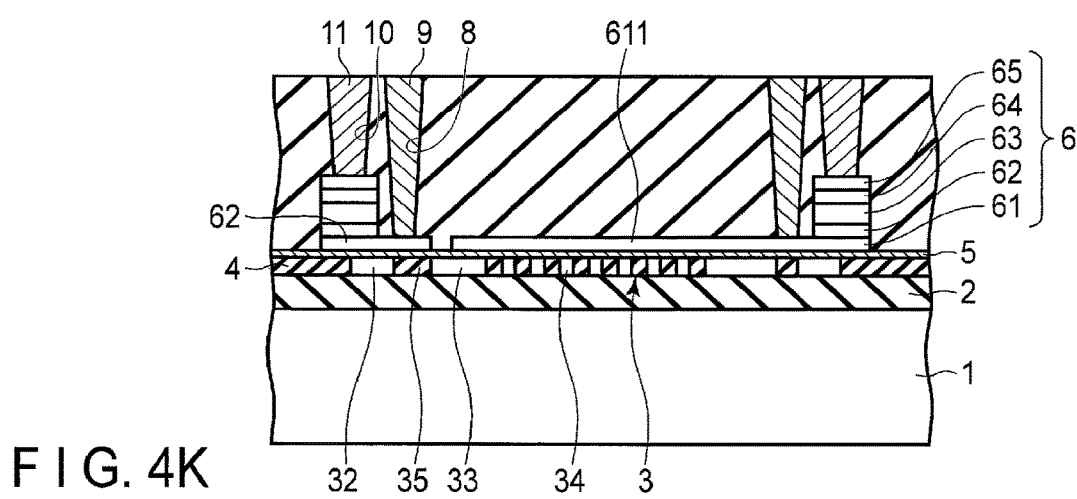

Subsequently, four layers, except for the contact layer 61 as the lowest layer, ranging from the contact layer 65 as the highest layer, the light confinement layer 64, the multiplex quantum well layer (an optical absorption layer) 63, to the light confinement layer 62, are selectively etched, using, as a mask, an annular resist pattern (not shown) formed by photo-etching process (see FIG. 4I). After that, resist pattern having the above-mentioned shape shown in FIG. 3 is formed in the contact layer 61 as the lowest layer and the four annular layers, i.e., annular upper layers by photo-etching process, and then selectively etching the contact layer 61 as the lowest layer, using the resist pattern as a mask. At this time, the contact layer 61 as the lowest layer has a structure that comprises the substantially rectangular second light input layer 611 provided on the low-refraction-index film ($SiO_2$ film) 5, opposed to the first light input layer 32, the second annular layer 612 provided on the low-refraction-index film 5, opposed to the first annular layer 33, and the four optical waveguides 612 provided on the low-refraction-index film 5, opposed to the first optical waveguides 33, and connecting the second light input layer 611 to the second annular layer 612. In addition, the outer periphery of the second annular layer 612 coincides with the outer peripheries of the four annular layers (the annular upper layers). By the above process, the annular semiconductor layer 6 comprising the contact layer 61 as the lowest layer, which includes the second light input layer 611, the second annular layer 612 and the second optical waveguide 612, is formed (see FIG. 4J).

Subsequently, the interlayer insulating film 7 is deposited on the whole surface. The interlayer insulating film 7 is selectively etched, using, as a mask, a resist pattern having an annular opening (not shown) formed by photo-etching process, thereby forming the first contact hole 8 having a lower end thereof reaching the second annular layer 612 of the contact layer 61 as the lowest layer. An electrode material layer for the first conductivity type is deposited on the interlayer insulating film 7 including the first contact hole 8. The annular electrode 9 made of the electrode material for the first conductivity type is embedded in the first contact hole 8 by etching back the electrode material layer for the first conductivity type, using CMP, such that the surface of the electrode will be level with the interlayer insulating film 7. After that, the interlayer insulating film 7 is selectively etched, using, as a mask, a resist pattern having an annular opening (not shown) with a larger diameter than the first contact hole 8 formed by photo-etching process, thereby forming the second contact hole 10 having its lower end reaching the contact layer 65 as the highest layer. An electrode material layer for the second conductivity type is deposited on the interlayer insulating film 7 including the second contact hole 10. The annular electrode 11 formed of the electrode material for the second conductivity type is embedded in the second contact hole 10 by etching back the electrode material layer for the second conductivity type, using CMP, such that the surface of the electrode will be level with the interlayer insulating film 7 (see FIG. 4K).

In addition, when the contact layer 61 as the lowest layer is selectively etched, etching may be performed to leave part of the contact layer 61 on the $SiO_2$ film 5 as a low-refraction-index film that is used as a foundation film, instead of removing the entire contact layer 61 along its thickness. By thus leaving part of the contact layer 61 as the lowest layer on the $SiO_2$ film 5, the adhesion of the contact layer 61 as the lowest layer to the $SiO_2$ film 5 can be maintained in a good state.

The semiconductor photo-receiving device according to the embodiment shown in FIGS. 1 to 3 has a structure in which the light propagation layer 3 and the semiconductor layer 6 including the lowest layer 61 and the upper layers 62, 63, 64 and 65 is provided on the substrate 1. The light propagation layer 3 and the contact layer 61 of the semiconductor layer 6, which is provided as the lowest layer on the light propagation layer 3, comprise the first and second light input layers 31 and 611 opposing each other and receiving light from the substrate 1 side, the first and second annular layers 32 and 612 provided around the first and second light input layers 31 and 611, respectively, and, for example, four first optical waveguides 33 and four second optical waveguides 613 opposing each other and optically coupling the first and second annular layers 32 and 612, respectively. The first light input layer 31 comprises the diffraction grating 34 that includes, for example, a plurality of areas cyclically arranged in a square grating. The upper layers 62, 63, 64 and 65 included in the semiconductor layer 6 are formed annular. The semiconductor layer 61 as the lowest layer in the semiconductor layer 6 functions as a photo-receiving portion. Moreover, the electrode 9 formed of the electrode material for the first conductivity type is connected to the contact layer 61 as the lowest layer mage of the first conductivity type semiconductor, and the electrode 11 formed of the electrode material for the second conductivity type is connected to the contact layer 65 as the highest layer made of the second conductivity type semiconductor.

In the above structure, light is emitted from the substrate 1 side below the first light input layer 31 of the light propagation layer 3 to enter the first light input layer 31, while DC voltages applies to the optical absorption layer 83 in the semiconductor layer 6 by the electrodes 9 and 11, i.e., with a reverse bias applied. The incident light is refracted and scattered radially obliquely upward by the diffraction grating 34 of the first light input layer 31. Part of the obliquely radially refracted and scattered light is propagated through the first light input layer 31, and reaches the first annular layer 32 via the first optical waveguides 33. The light reaching the first annular layer 32 passes through the low-refraction-index film 5, and enters the second annular layer 612 of the contact layer 61 as the lowest layer, which is located above and opposes the first light input layer 31.

On the other hand, the greater part of the light refracted and scattered radially obliquely upward passes through the low-refraction-index film 5 to the second light input layer 611 of the contact layer 61 as the lowest layer, propagates through the second light input layer 611, and enters the second annular layer 612 via the second optical waveguides 613.

That is, when light is allowed to enter the first light input layer 31, including the diffraction grating 34 of the light propagation layer 3, from the substrate 1 side located below the layer 31, it radially propagates through the first light input layer 31, and reaches the second annular layer 612 of the contact layer 61 as the lowest layer via the first optical waveguides 33 and the first annular layer 32. Further, the light entered the diffraction grating 34 of the first light input layer 31 is refracted and scattered radially obliquely upward, passes through the low-refraction-index film 5 to the second light input layer 611 of the contact layer 61 as the lowest layer, radially propagates through the second light input layer 611, and reaches the second annular layer 612 via the second optical waveguides 613. As a result, in the second annular layer 613, two light beams entered through two routes are collected, and the collected light is directed to and absorbed by the optical absorption layer 63 of the annular semiconductor layer 6. Therefore, the light absorption efficiency of the optical absorption layer 63 with respect to the incidence light from the substrate 1 side can be increased remarkably.

Moreover, since the upper layers including the optical absorption layer 63 in the semiconductor layer 6 are formed annular and have a small photo-receiving area, its capacity or volume can be reduced. As a result, it can reliably receive a high-speed modulated light signal.

Figure 6:
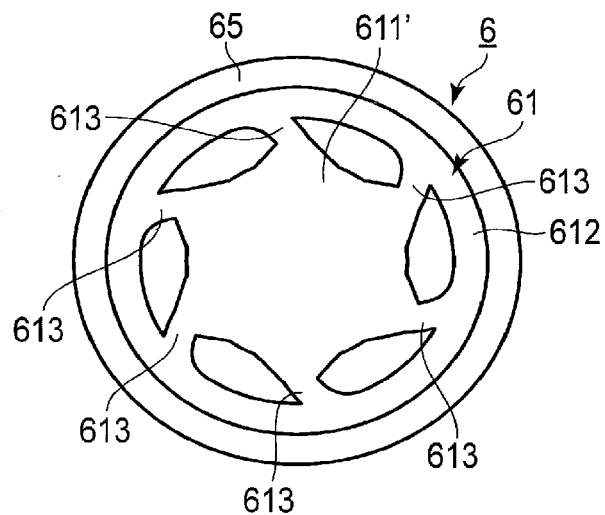
FIG. 6 is a plan view showing the lowest layer of a semiconductor layer incorporated in the semiconductor photo-receiving device of said another embodiment.

In another embodiment, the light propagation layer 3 and the contact layer 61 as the lowest layer may have structures as shown in FIGS. 5 and 6, respectively. In FIGS. 5 and 6, members similar in shape to those shown in FIGS. 2 and 3 are denoted by corresponding reference numbers, and are not described in detail.

That is, in the light propagation layer 3 shown in FIG. 5, a first light input layer 31' is formed substantially hexagonal. The first light input layer 31' comprises an amorphous silicon layer having circular through holes arranged two-dimensionally cyclically, and a plurality of areas formed by filling the holes with a low-refraction-index material, such as $SiO_2$, so that these areas are level with the silicon layer. The areas of the diffraction grating 34' are arranged in a triangular grating form. The first light input layer 31' and the first annular layer 32 are optically coupled at a circumferential angle of 60° by a plurality of (e.g., six) first optical waveguides 33.

In the contact layer 61 as the lowest layer shown in FIG. 6, a second light input layer 611' is formed substantially hexagonal. The second light input layer 611' and the second annular layer 612 are optically coupled at a circumferential angle of 60° by a plurality of (e.g., six) second optical waveguides 613.

The above-described embodiment provides an advantage similar to that of the first-mentioned embodiment.

EXAMPLE

Referring again to FIGS. 1 to 3, an example will be described in detail.

A substrate 1 was formed of silicon, and an insulating layer 2 having a thickness of 450 nm and formed of $SiO_2$ was provided on the substrate 1. As is shown in FIGS. 1 and 2, a light propagation layer 3 was formed on the insulating layer 2. The light propagation layer 3 had a structure which comprises a substantially rectangular first light input layer 31 formed of amorphous silicon and having a thickness of 400 nm, a first annular layer 32 formed of amorphous silicon, having a thickness of 2.2 μm, a width of 0.6 μm and a diameter of 148 μm, and provided on the insulating layer 2 around the first light input layer 31 at a desired distance therefrom, and four optical waveguides 33 made of amorphous silicon, provided on the insulating film 2 and connecting (optically coupling) the first light input layer 31 to the first annular layer 32. The first light input layer 31 was formed to have a diffraction grating 34. The diffraction grating 34 was formed to have a square grating of 745-nm-cycle, which is formed by providing an amorphous matrix layer with a plurality of circular areas formed of $SiO_2$ and having a diameter of 430 nm.

A semiconductor layer 6 having a circular outer peripheral shape was provided on a low-refraction-index film ($SiO_2$ film) 5 having a thickness of 150 nm, opposing the above-mentioned light propagation layer 3. The semiconductor layer 6 was formed of a contact layer 61 as a lowest layer and upper layers, i.e., a light confinement layer 62, a multiplex quantum well layer (an optical absorption layer) 63, a light confinement layer 64 and a contact layer 65, which were stacked in this order. The contact layer 61 was made of n-type InP and having a thickness of 600 nm. The light confinement layer 62 was made of n-type InAlGaAs/InP and having a thickness of 350 nm/400 nm. The multiplex quantum well layer 63 was made of $In_xAlGaAs/In_yAlGaAs$ (x>y) and having a thickness of 250 nm. The light confinement layer 64 was made of p-type InP/InAlGaAs and having a thickness of 200 nm/200 nm. The contact layer 65 made of p-type InP and having a thickness of 200 nm.

As is shown in FIGS. 1 and 3, the contact layer 61 as the lowest layer was formed of a substantially rectangular second light input layer 611 provided on the low-refraction-index film 5 opposed to the first light input layer 32, made of amorphous silicon, and having a thickness of 600 nm, a second annular layer 612 provided on the low-refraction-index film 5 opposed to the first annular layer 33, made of amorphous silicon, and having a thickness of 600 nm, a width of 3 μm and a diameter of 150 μm, and four second optical waveguides 613 provided on the low-refraction-index film 5 opposed to the first optical waveguide 33, and made of amorphous silicon that optically couples the second light input layer 611 to the second annular layer 612. The second light input layer 611 was formed to the same shape as the first light input layer 31. The second annular layer 612 was formed to a shape similar to and greater than the first annular layer 32.

The n-type electrode 9 was made of Ti/Pt/Au, and the p-type electrode 11 was made of Ti/Pt/Au.

Figure 7:
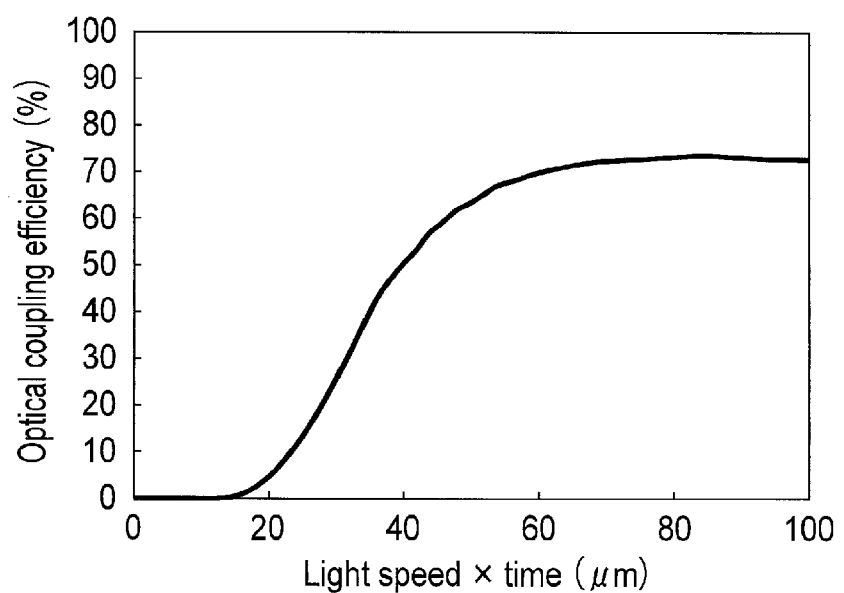
FIG. 7 shows the optical coupling efficiency, with respect to incident light, of light propagating through the optical absorption layer, assumed when light is entered from the substrate side in the semiconductor photo-receiving device of each embodiment.

In the semiconductor photo-receiving device constructed as the above, a DC voltage was applied to the n-type electrode 9 and the p-type electrode 11, and a reverse bias was applied to the optical absorption layer 63 in the semiconductor layer 6. In this state, light was allowed to enter the first light input layer 31 of the light propagation layer 3 from the substrate 1 side positioned below. At this time, the conversion rate (optical coupling efficiency: %) of light propagating through the optical absorption layer 63 with respect to the incident light was calculated by computer simulation (FDTD method). FIG. 7 shows the result of calculation.

From FIG. 7, it was confirmed that in the semiconductor photo-receiving device according to the example, 70% or more of the incident light from the substrate side was converted into propagation light, which means highly efficient surface photo-receiving.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor photo-receiving device comprising:
   a substrate;
   a light propagation layer provided on the substrate;
   a semiconductor layer provided on the light propagation layer, the semiconductor layer including a lowest layer and upper layers, the upper layers including an optical absorption layer; and
   an electrode which applies a voltage to the optical absorption layer,
   wherein
   the light propagation layer comprises a first light input layer, a first annular layer provided around the first light input layer at a desired distance from the first light input layer, and a first optical waveguide connecting the first light input layer to the first annular layer;
   the lowest layer of the semiconductor layer comprises a second light input layer, a second annular layer provided around the second light input layer at a desired distance from the second light input layer, and a second optical waveguide connecting the second light input layer to the second annular layer;
   the first and second light input layers oppose each other, the first and second annular layers oppose each other, and the first and second optical waveguides oppose each other;
   the first light input layer includes a diffraction grating; and
   the upper layers of the semiconductor layer are formed annular.

2. The device of claim 1, wherein the first optical waveguide has a width thinning from the first light input layer to the first annular layer, and the second optical waveguide has a width thinning from the second light input layer to the second annular layer.

3. The device of claim 1, wherein the first light input layer and the first annular layer are connected by two or more first optical waveguides, and the second light input layer and the second annular layer are connected by two or more second optical waveguides.

4. The device of claim 1, wherein a relationship of $\lambda \leq d \leq 2\lambda$ is satisfied where d is a thickness of the lowest layer of the semiconductor layer, and $\lambda$ is a wavelength of light received.

5. The device of claim 1, wherein the light propagation layer has a thickness of 0.2 to 0.5 µm.

6. The device of claim 1, wherein the semiconductor layer is made of a group III-V semiconductor.

7. The device of claim 6, wherein the group III-V semiconductor is an InP-based semiconductor, a GaAs-based semiconductor, or a GaN-based semiconductor.

8. The device of claim 1, wherein the diffraction grating comprises a matrix layer, and a plurality of areas two-dimensionally cyclically provided in the matrix layer and having a refraction index different from a refraction index of the matrix layer.

9. The device of claim 8, wherein the matrix layer is made of silicon, and the areas are made of a material selected from a group of $SiO_2$, SiN, AlN, $Al_2O_3$ and $AlO_x$ (1<x<1.5).

10. The device of claim 8, wherein the areas are arranged in a triangular grating form.

11. The device of claim 8, wherein the areas are arranged in a square grating form.

* * * * *